(12) United States Patent
Vasyliev et al.

(10) Patent No.: US 9,035,552 B2
(45) Date of Patent: May 19, 2015

(54) METHOD AND DEVICE FOR TRANSPORTING VACUUM ARC PLASMA

(75) Inventors: Volodymyr Vasilievich Vasyliev, Kharkov (UA); Volodymyr Evgenievich Strelnytskiy, Kharkov (UA)

(73) Assignee: National Science Center "Kharkov Institute of Physics and Technology", Kharkiv (UA)

( * ) Notice: Subject to any disclaimer, the term of this patent is extended or adjusted under 35 U.S.C. 154(b) by 225 days.

(21) Appl. No.: 13/877,708

(22) PCT Filed: Oct. 31, 2011

(86) PCT No.: PCT/UA2011/000105
§ 371 (c)(1),
(2), (4) Date: Apr. 4, 2013

(87) PCT Pub. No.: WO2012/064311
PCT Pub. Date: May 18, 2012

(65) Prior Publication Data
US 2013/0214684 A1    Aug. 22, 2013

(30) Foreign Application Priority Data
Nov. 8, 2010    (UA) ................................ 2010 13230

(51) Int. Cl.
  H05H 1/48    (2006.01)
  C23C 14/32    (2006.01)
  H01J 27/14    (2006.01)
  H01J 37/32    (2006.01)

(52) U.S. Cl.
  CPC ................ *H05H 1/48* (2013.01); *C23C 14/325* (2013.01); *H01J 27/14* (2013.01); *H01J 37/32055* (2013.01); *H01J 37/3266* (2013.01)

(58) Field of Classification Search
  CPC ...... H05H 1/48; H01J 27/14; H01J 37/32055; H01J 37/3266

USPC ............. 315/111.21, 111.41, 111.71, 111.81, 315/111.91
See application file for complete search history.

(56) References Cited

U.S. PATENT DOCUMENTS 8,698,400 B2 *    4/2014    Scherer et al. ........... 315/111.41
2002/0007796 A1    1/2002    Gorokhovsky

FOREIGN PATENT DOCUMENTS

RU    2369664    10/2009
UA    87880 C2    8/2009

* cited by examiner

*Primary Examiner* — Hai L Nguyen
(74) *Attorney, Agent, or Firm* — Aleksandr Smushkovich

(57) ABSTRACT

The proposed method allows forming cathode arc plasma flows for high quality coatings. The plasma flows are transported in a plasma-optical system by means of a transport magnetic field generated by electromagnetic coils, superpositioning a constant magnetic field and additional variable magnetic fields deflecting the plasma flows from internal surfaces of the system's elements. In a device for implementing the proposed method, an arc power supply is connected to an anode via a coil, surrounding the anode. In a linear embodiment of the system, an electrically conductive tube section inside the anode is connected to one end of the deflection coil. The other end is connected to the positive terminal of power supply. In the system's non-linear embodiment, additional magnetic fields are established using two additional electromagnetic coils, surrounding the anode and a nonlinear part respectively. The method and device allow for a significantly reduction of losses of macroparticle-free plasma.

12 Claims, 1 Drawing Sheet

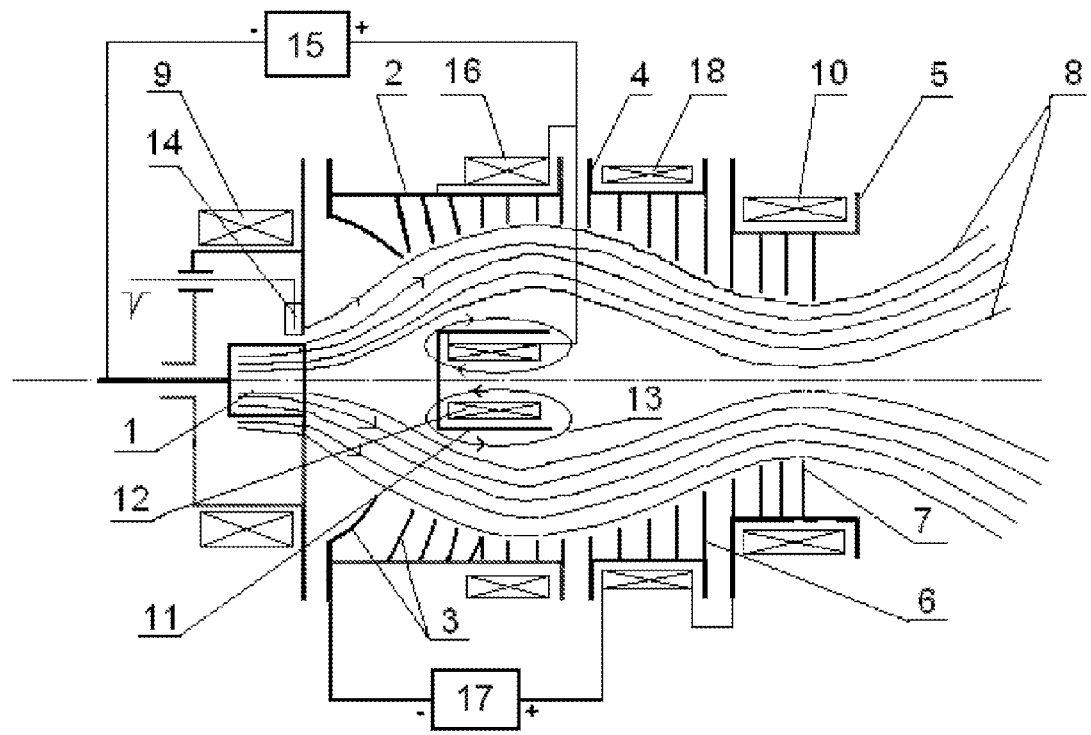

METHOD AND DEVICE FOR TRANSPORTING VACUUM ARC PLASMA

CROSS-REFERENCE TO RELATED APPLICATIONS

This application is a U.S. national phase application of a PCT application PCT/UA2011/000105 filed on 31 Oct. 2011, published as WO2012/064311, whose disclosure is incorporated herein in its entirety by reference, which PCT application claims priority of a Ukrainian patent application UA a2010/13230 filed on 8 Nov. 2010.

FIELD OF THE INVENTION

The invention relates to a technique for forming flows of vacuum arc cathode erosion plasma to produce high-quality coatings for various applications, requiring the following material properties: wear-resistant, friction proof, decorative, etc.; and for surface modification of materials by irradiation with ion and/or electron fluxes.

BACKGROUND OF THE INVENTION

It is known that vacuum arc cathode plasma is transported and filtered from macroparticles in the crossed electric and magnetic fields, when its electrons are magnetized and ions are un-magnetized. In such conditions, the ions are focused optically, and systems that provide for such focusing are referred to as plasma-optical systems.

Vacuum arc cathode plasma is generated during electric arc evaporation of the cathode material by vacuum-arc cathode spots in the form of high-speed plasma jets and macroparticle flows. Macroparticles are formed from the liquid phase of the vacuum arc cathode spots. Plasma jets can be controlled through magnetic and electric fields. Macroparticles move independently from magnetic or electric fields, virtually on linear paths. They are characterized by a higher mass compared to plasma ions and a small charge per their mass unit. Therefore, macroparticles can be reflected only using appropriate means in the form of screens or captured by special traps. Presence of the means to reflect or capture macroparticles narrow the plasma-guide channel. This causes a significant reduction in the plasma flow at the transport system outlet due to plasma losses in these means.

There is known a method [Reference-1] that provides for transporting of vacuum arc cathode plasma with macroparticle filtering from an electric arc evaporator to a transport system outlet. The transporting is effected in response to a nonlinear time-constant transport magnetic field. The magnetic field is created using electromagnetic coils.

There is known a plasma-optical system [Reference-1] for implementation of the above-described method, which system comprises a plasma guide. The transport magnetic field is established using electromagnetic coils encircling (surrounding) the cathode, the anode, and the plasma guide. In such system, the plasma guide is curved in the shape of a quarter torus and electrically insulated from the anode.

Reduction of plasma transport losses in such curved plasma-optical systems requires powerful magnetic fields or large plasma guide and anode cross-sections. This is a disadvantage of both the above-described method and the device for its implementation. Another disadvantage of the above-described method and system is a significant inhomogeneity of the plasma flow intensity across its section at the plasma guide outlet. A time-averaged plasma flow at the outlet of the plasma source in the above-described plasma-optical system is not uniformly (not evenly) distributed on the deposited surface. Such non-uniform distribution is caused by significant plasma losses during its emission from the peripheral area of the consumable cathode's butt end. Therefore, it is quite a problem to obtain uniform-thickness coatings on the surface with a spot diameter larger than the cathode's diameter without rotating the base about its axis.

The nearest related art (herein called a 'prototype') for the claimed method is a method [Reference-2] for transporting of vacuum arc cathode plasma with macroparticle filtering in a plasma-optical system (also described in [Reference-2]) by a transport magnetic field having a constant time component.

The prototype is referred to as a linear plasma-optical system [Reference-2] for transporting vacuum arc cathode plasma. It comprises a cathode; an anode; a plasma guide with electromagnetic coils encircling the cathode and anode; an arc power supply source; and macroparticle reflectors; an electromagnetic deflection coil placed inside an electroconductive tube segment. This tube segment is coaxially placed inside the anode, electrically connected thereto, and is screened on the cathode end.

The electromagnetic deflection coil is designed to create a magnetic field directed opposite to the magnetic field created by the electromagnetic coils encircling the cathode, the anode, and the plasma guide.

When using the aforementioned method and device, plasma flows from the cathode spots of the arc in the vacuum electric arc discharge travel along the transporting magnetic field and travel around the tube segment inside the anode. This somewhat reduces plasma losses due to a reduction of deposits on the section.

However, despite some reduction in such losses, the prototype method, and the prototype system have disadvantages still resulting in significant losses of plasma flows during their transporting. One of such disadvantages is formation of a magnetic mirror in the gap between the inner anode surface and outer lateral surface of the aforesaid tube segment due to increasing the intensity of magnetic field in the longitudinal direction. Thereby, plasma electrons, having kinetic energy in the transverse direction to the magnetic field greater than the one in the longitudinal direction thereto, are captured in a magnetic trap limited by the areas with the magnetic field maxima. One such maximum is located close to the evaporable cathode butt end, while another one is located in the gap between the anode inner surface and outer lateral surface of the aforesaid tube segment. The electrons captured in the magnetic trap, while moving along the magnetic field lines, are repeatedly reflected from magnetic plugs formed in the areas with the magnetic field maxima. These reflections increase their retention time in the area between the magnetic plugs. In this time interval, a significant part of the trapped electrons, proportional to their retention time, escape from the plasma flow to the anode inner surface. Such escape of electrons occurs predominantly due to their drift towards the anode inner surface in response to the electric field cross-polarizing of the plasma jet in the magnetic field. The velocity of such drift is directly proportional to the electric polarization field intensity and inversely proportional to the magnetic field intensity.

The electric polarization field is formed due to magnetized electrons drifting relative to un-magnetized ions across the magnetic field and outer electric field, as well as due to electrons drifting transversely to the magnetic field and its transverse gradient directed towards the outer surface of the aforesaid tube segment. In such conditions, both drifts sum up, thus increasing the plasma jet transverse polarization and, consequently, the velocity of electron drift onto the anode inner surfaces. According to a plasma quasi-neutrality condition, the corresponding number of ions escape the plasma. This respectively reduces the ion current at the anode outlet.

A second disadvantage reducing the average output ion current from a plasma source is caused by the reasons shown below. For a fixed arc current, the difference of potentials between the plasma jet and the anode, or between the plasma jet and the plasma guide, varies consistently due to continuous variations in the positions of arc cathode spots moving across the cathode butt end surface. If the cathode spots move in the peripheral area of the cathode butt end surface, the plasma jets coming out of these spots travel close to the inner surfaces of the screens on the anode and the plasma guide. The closer the plasma jet approaches the anode and plasma guide inner surfaces, the more plasma is lost on these surfaces, thus reducing the ion current from the plasma source. This disadvantage is common for all the existing electric arc plasma sources, wherein transporting the cathode plasma with macroparticle filtering is effected in a similar manner in a similar system, both in the prototype and other related art methods and systems.

OBJECTS AND SUMMARY OF THE INVENTION

A primary object of the invention is to improve both the method for transporting of vacuum arc cathode plasma with macroparticle filtering and the device for its implementation. These improvements are designed to reduce plasma losses during its transporting. To achieve this object, it is necessary to provide for such plasma flow transport conditions that, for various positions of the arc cathode spots on the cathode butt end surface, would allow plasma flows to efficiently move around structural elements on plasma source surfaces that reflect and capture macroparticles.

The problem is solved in the proposed method for vacuum arc cathode plasma transporting with macroparticle filtering. In this method, as well as in the prototype method, vacuum arc cathode plasma transporting with macroparticle filtering is effected in a plasma-optical system by a transporting magnetic field having a constant time component.

Unlike the prototype, in the proposed invention, a transported plasma flow is exposed to additional magnetic fields, whose intensities are varied proportional to electric currents running through structural elements of an inventive linear (straight-lined) plasma-optical system. A linear plasma-optical system includes an anode and a plasma guide both having linear shapes. The additional magnetic fields are created using additional electromagnetic coils. When the plasma flow approaches the surface of a structural element of the inventive linear system, the intensity of corresponding additional magnetic field is increased proportional to an intensity of the electric current running through this element.

In the inventive plasma-optical system with a plasma guide, the constant component of the transporting magnetic field is created with two electromagnetic coils, one of which encircles the system's cathode, and the other one encircles the system's plasma guide close to the guide's outlet.

The intensity of the additional magnetic field inside the system's anode is varied so that for a specified arc current flowing through the anode, the intensity is inversely proportional to variations in the anode voltage drop.

The additional magnetic fields inside the anode are created with an electromagnetic coil encircling the anode and an electromagnetic deflection coil coaxially placed inside the anode. Arc electric currents are flown through the coils.

The inventive plasma-optical system comprises a plasma guide; the additional magnetic field is created inside the plasma guide with at least one additional electromagnetic coil encircling the plasma guide, through which coil the current, flowing through this plasma guide, is run.

The plasma flow moving from the anode can be transported via the plasma guide. For this purpose, the plasma guide includes two parts: an inlet part and an outlet part; these parts are electrically insulated from each other and from the anode.

In this case, the plasma flow inside the plasma guide is exposed to an additional magnetic field excited with an additional electromagnetic coil, encircling the plasma guide inlet part, through which coil the electric current, flowing through the plasma guide outlet part, is run. The intensity of the additional magnetic field is increased in a direct ratio to the increase of the electric current flowing through the plasma guide outlet part, when a positive (relative to the anode) potential is supplied to the plasma guide outlet part. This reduces plasma losses at a narrowing entrance of the plasma guide outlet.

In an inventive nonlinear (curvilined) plasma-optical system (including a plasma guide with a nonlinear part), the constant transporting magnetic field has to be uniform as much as possible, especially in the nonlinear part, wherein the most intensive plasma losses occur. Therefore, to minimize plasma losses both in the plasma guide and in the anode, the plasma flow is exposed to additional magnetic fields co-directed with the constant transporting magnetic field. The additional magnetic fields are established using two additional electromagnetic coils, which encircle the anode and the aforesaid nonlinear part respectively.

The additional magnetic field inside the anode, both for the linear and the nonlinear plasma-optical systems, is established using an additional electromagnetic coil encircling the anode. The coil's magnetic field has to be co-directed with the constant transport magnetic field on the plasma-optical system's axis. In so doing, the intensity of the additional magnetic field is varied so that for a specified potential difference between the cathode and the anode, its value would be in direct ratio to the arc current flowing through the anode, or for a specified arc current flowing through the anode it would be in reverse ratio to the anode's potential drop.

During a plasma flow transporting in a linear inventive plasma-optical system inside the anode, the plasma flow is also exposed to another additional magnetic field. This field is established using an electromagnetic deflection coil coaxially placed inside the anode. This coil's electromagnetic field is directed opposite to the constant transporting magnetic field on the plasma-optical system's axis. In this case, the intensities of the additional magnetic fields inside the anode are increased in direct ratio to the magnitude of those arc current components that flow through the anode and the electromagnetic deflection coils.

Further transporting the plasma flows coming out of the anode section is effected in the plasma guide, inside of which plasma guide, the plasma flow is exposed to an additional magnetic field co-directed with the constant transporting magnetic field. This additional magnetic field is generated using an additional electromagnetic coil encircling the plasma guide. The intensity of additional magnetic field is increased in direct ratio to an increase in the electric current flowing through the plasma guide, when a positive (relative to the anode) potential is supplied to the plasma guide.

The problem is solved in the inventive linear plasma-optical system proposed for the transporting of vacuum arc cathode plasma. This system, like the prototype system, includes a cathode, an anode, and a plasma guide with electromagnetic coils encircling the aforementioned elements. The system further includes an arc power supply source and macroparticle reflectors. The system also includes an electromagnetic deflection coil placed inside an electro-conductive tube segment coaxially placed inside the anode, electrically connected thereto, and screened on the cathode side.

Unlike in the prototype, in the inventive linear plasma-optical system, a positive terminal of the arc power supply source is electrically connected to the anode through an electromagnetic coil encircling the anode and connected to the aforesaid tube segment through an electromagnetic deflection coil.

In this system the electromagnetic deflection coil inside the tube segment can be formed of a water-cooled pipe.

In the above described inventive plasma-optical system, the plasma guide can be encircled with an additional electromagnetic coil, whose one end is electrically connected to the plasma guide and the other end is electrically connected to the positive terminal of a separate power supply source, whose negative terminal is connected to the anode.

In another embodiment of the inventive plasma-optical system, the plasma guide can be composed of two parts (inlet and outlet) electrically insulated from each other and from the anode. In such embodiment, the inlet part is encircled by an additional electromagnetic coil. One end of the additional electromagnetic coil is electrically connected to the outlet part. The other end of the aforesaid coil is connected to the positive terminal of a separate power supply source, whose negative terminal is connected to the anode.

Below is an explanation of how the deflective action of additional magnetic fields on the plasma flows, during their approach to the surfaces of the plasma-optical system's structural elements with macroparticle reflectors, carried out at the above described conditions, allows reducing plasma flow transporting losses.

For achieving this in the inventive linear plasma-optical system, the constant component of the transporting magnetic field must have a configuration convex from the axis of the system, which is implemented, as shown above, with two electromagnetic coils encircling the cathode and the plasma guide's outlet part respectively. A transverse gradient of this magnetic field's component is directed towards the axis of the plasma-optical system. Inside the plasma jet, the gradient induces separation of the electrical charges that create an electric polarization field directed transversely to the magnetic field and the gradient thereof. This electric field causes electrons to drift transversely to the magnetic field and the electric polarization field, i.e. towards the inner surface of the anode. This, to a certain degree, reduces plasma deposits on the tube segment with a dead butt end placed inside the anode.

For intensifying this effect, the above mentioned transverse gradient has to be sufficient for the plasma electron gradient drift to be at least as high as the velocity of an oppositely directed electron drift in the electric field between the plasma jet and the tube segment placed inside the anode under its potential. This is ensured by the effect of an additional magnetic field established with an electromagnetic coil coaxially placed inside the tube segment located inside the anode. The field intensity increases in direct ratio to an increase of the arc current's portion flowing through the tube segment, since it is electrically connected to an end of the electromagnetic deflection coil winding, whereas the other end is connected to the positive terminal of the vacuum arc power supply source. As a consequence, the plasma flows drawn out of the cathode spots close to the cathode's axis are more efficiently deflected from the outer surface of the aforesaid tube segment towards the anode inner surface, thus leading to significantly lower losses of ions from the plasma jet on this macroparticle-reflecting structural element.

However, during electric arc evaporation, when cathode spots travel on the periphery of the cathode butt end surface, the plasma flows emitted by these cathode spots closely approach the surfaces of macroparticle reflectors on the anode and the plasma guide. For reduction of plasma losses on these surfaces, the plasma flows are exposed to corresponding additional magnetic fields co-directed with the constant transporting magnetic field. These fields are established by electromagnetic coils encircling the anode and the plasma guide respectively and duly connected as described above to the power supply sources. Therefore, the intensities of these fields are increased when the plasma flows have to be deflected from the corresponding surfaces, and decreased when the plasma flows withdraw from them. This ensures reduced plasma flow losses during the transporting thereof.

BRIEF DESCRIPTION OF DRAWING OF THE INVENTION

The nature of invention is explained by an attached drawing FIGURE that illustrates the inventive device for implementation of the inventive method.

DETAIL DESCRIPTION OF PREFERRED EMBODIMENTS OF THE INVENTION

While the invention may be susceptible to embodiment in different forms, there are described in detail herein below, specific embodiments of the present invention, with the understanding that the present disclosure is to be considered an exemplification of the principles of the invention, and is not intended to limit the invention to that as illustrated and described herein.

BEST IMPLEMENTATION EXAMPLES OF THE INVENTION

Example 1

As an implementation example of the claimed invention, a preferred embodiment of the inventive device is described below. This is a linear embodiment of the inventive plasma-optical system for transporting of vacuum arc cathode plasma with macroparticle filtering. This system (see FIGURE) comprises a cathode 1 and an anode 2, with macroparticle reflectors placed therein shaped as annular screens 3.

The system comprises a plasma guide including two parts: an inlet 4 and an outlet 5, which are electrically insulated from each other and from the anode 2. Inside, these plasma guide parts contain macroparticle reflectors shaped as sets of annular screens 6 and 7. The constant component of a transport magnetic field 8 is formed by electromagnetic coils 9 and 10, which encircle the cathode 1 and the outlet 5 respectively.

Inside, the anode 2 contains a macroparticle reflector (filtering element) placed in coaxial relationship therewith and shaped as a tube segment 11 with a dead butt end directed towards the cathode 1.

Inside, the tube segment 11 contains an electromagnetic deflection coil 12 with winds (winding turns) made of a pipe for water cooling. The deflection coil 12 is coaxially mounted in the tube segment 11.

The electromagnetic coil 12 is designed to create (excite) an additional magnetic field 13 directed oppositely to the constant part of a transporting magnetic field 8 on the system's axis. A unit 14 is designed to ignite the vacuum arc and is mounted at a predetermined distance from the cathode 1. A vacuum arc power supply source 15 is connected to the anode 2 through an electromagnetic coil 16 that encircles the anode 2. The tube segment 11 is electrically connected to an end of the electromagnetic deflection coil 12 winding. The other end of the coil 12 is connected to a positive terminal of the vacuum arc power supply source 15. The plasma guide is connected to a separate power supply source 17, whose negative terminal is connected to the anode 2, and whose positive terminal is connected to the outlet 5 through a coil 18 that encircles the inlet 4.

The method implementation is exemplified by explaining operation of the inventive device described above.

The arc is ignited by feeding a high-voltage pulse to the arc ignition unit 14 (see FIGURE), thus initiating the excitation of the arc cathode spot on the lateral surface of cathode 1, which is driven by the magnetic field onto the cathode's butt end surface. Depending on the arc current, the butt end surface of cathode 1 may generate several cathode spots, which, traveling across the surface, emit jets of high-ionization cathode plasma along with macroparticles of the cathode's material. The macroparticles, traveling on linear paths, are delayed by the reflectors 3, 6, 7 and the butt end surface of the tube segment 11. The plasma jets, whose ionization approaches 100%, traveling along the convexly configured transporting magnetic field 8 that passes around the tube segment 11, move through all apertures of the reflectors 3, 6, 7 towards the plasma-optical system's outlet. Depending on the position of the arc cathode spot on the cathode butt end surface, the plasma flow ejected from the spot is affected by additional magnetic fields. These fields, using the electromagnetic coils 16 and 18, excite the anode 2 and the inlet 4 respectively. These fields change the configuration and the intensity of the transporting magnetic field, whose constant component is created using the electromagnetic coils 9 and 10. The plasma flow is also affected by the additional deflecting magnetic field 13 inside the anode 2.

If the power supply source 15 operates in the fixed arc current mode, the intensities of the additional magnetic fields inside the anode 2 will be proportional to the arc currents flowing through the anode 2 and the tube segment 11 of the macroparticle reflector 11. The intensities of these fields will also be inversely proportional to the anode potential drop. If the source 15 operates in the fixed voltage mode, then for the plasma flows approaching the inner surface of the anode 2 or the outer surface of the tube segment 11, the anode current to these electrodes will increase. This, in turn, will increase the electric current flowing through the respective coil 16 or coil 12, and the intensity of the respective magnetic field that will increase proportional to this current, thus driving the plasma flow from the wall of the respective plasma source structural element.

Due to connection of the power supply source positive terminal 17 to the outlet 5 through the additional electromagnetic coil 18, the intensity of the additional magnetic field inside the will be proportional to the intensity of the electric current flowing through the outlet 5.

Under the aforesaid conditions and for any travels of cathode spots on the cathode's butt end surface, a dynamic equilibrium of plasma flows is achieved in the transport area along the magnetic field, wherein plasma losses transversely to the magnetic field will be minimal. In this case, stability of such dynamic equilibrium of plasma flows and stabilization of voltage drop on the arc grows proportional to the arc current.

Example 2

Another preferred embodiment of the proposed method and device implementing a nonlinear plasma-optical system differs from the above-described embodiment of linear plasma-optical system in that the constant component of the transport magnetic field is created by electromagnetic coils encircling the cathode, the anode, and the plasma guide.

Inside the anode of a nonlinear system there is no tube segment with an electromagnetic deflection coil placed therein. The nonlinear plasma-optical system's operation in the arc direct current mode differs in the method of excitation of the additional electromagnetic coil encircling the anode 2. The difference, more particularly, is that the coil is excited from a separately controlled power supply source, which comprises a direct-current amplifier with a negative feedback on the anode voltage drop $U_a$ on the arc corresponding to the ratio: $U_a = U_{arc} - U_c$, where $U_c$ and $U_{arc}$ are cathode arc voltage drop and total arc voltage drop respectively.

In this particular case, $U_a$ is determined through a comparator, which sets a constant magnitude of $U_c$ selected for the specified cathode material. In absence of the arc discharge, $U_{arc} = U_{ocv}$, where $U_{ocv}$ is open circuit voltage of the arc power supply source.

Under such conditions, the power supply source of the additional electromagnetic coil is cut off and the current in the coil equals zero. During the arc ignition, $U_a$ decreases and the coil power supply source is triggered on. In consequence, the coil will be passing the current inversely proportional to the anode potential drop $U_a$, thus generating a corresponding additional magnetic field.

When plasma jets approach the anode inner surface, $U_a$ decreases and the intensity of the additional magnetic field inside the anode correspondingly increases. When plasma jets withdraw from the anode inner surface towards its axis, $U_a$ increases and the intensity of the field inside the anode correspondingly decreases. This influence of the additional magnetic field on plasma flows does not deteriorate stability of the arc discharge, and plasma transport losses inside the anode are on the average reduced. During further transporting of the plasma flows in the plasma guide, the positive terminal with respect to the anode is fed to the nonlinear plasma guide through an additional electromagnetic coil encircling the plasma guide.

INDUSTRIAL APPLICABILITY

The experiments carried out using the device manufactured from real and available structural elements demonstrated that the proposed method and device for transporting of vacuum arc cathode plasma in a linear filtering plasma-optical system provides at least a 1.5-fold increase in the average outlet ion flux over the prototype at an arc current of 100 A. Further, the minimum and the maximum values of the outlet ion flux were 3.5 A and 4 A respectively. For the case when the arc current is brought up to 110 A, the minimum and the maximum outlet ion flux values increase to 4 A and 5 A respectively.

Thus, the data provided evidence that the proposed invention can be implemented to deposit high-quality coatings for various applications. Provision of the above described plasma flow transport conditions significantly improves productivity of the coating deposit process, devoid of the defects caused by macroparticles.

REFERENCES CITED

Reference 1. I. I. Aksyonov, V. A. Belous, V. G. Padalka, V. M. Khoroshikh. Device for Vacuum Arc Plasma Cleaning from Macroparticles//Instruments and Experimental Techniques, No. 5, 1978, p. 236-237.

Reference 2. Ukrainian Patent 87880. International Patent Classification C23C14/00. Vacuum Arc Plasma Source, 2009 (prototype).

The invention claimed is:

1. A method for transporting vacuum arc cathode plasma flows with macroparticle filtering in a plasma-optical system including an anode and a plasma guide, wherein electric currents run at least through the anode and the plasma guide, producing voltage drops in the anode and in the plasma guide; said method comprising the steps of:
   creating a constant magnetic field component within the plasma-optical system;
   creating intensity-variable additional magnetic field components within the plasma-optical system, said additional magnetic field components are characterized with variable intensities;
   superposing said constant magnetic field component with said additional magnetic field components, thereby creating a transporting magnetic field; and
   transporting said plasma flows in response to the transporting magnetic field within the plasma-optical system;
wherein:
   the variable intensities are varied proportional to said electric currents, or the variable intensities are varied inversely proportional to variations of said voltage drops in the anode and in the plasma guide.

2. The method according to claim 1, wherein said plasma-optical system is a linear plasma-optical system, wherein said anode and said plasma guide have linear shapes; said linear plasma-optical system further comprises:
   a cathode,
   a first electromagnetic coil, and
   a second electromagnetic coil;
said plasma guide further includes an outlet portion for exiting said plasma flows;
wherein
   said constant magnetic field component is excited by said first electromagnetic coil and said second electromagnetic coil; and
   the first electromagnetic coil encircles the cathode, and the second electromagnetic coil encircles the plasma guide in a predetermined region of said outlet portion.

3. The method according to claim 1, wherein one additional magnetic field of said additional magnetic fields components is created within said anode; the one additional magnetic field is characterized by a variable intensity;
wherein:
   (a) when a predetermined electric current is run through the anode, producing an anode voltage drop therein, then said variable intensity is varied being inversely proportional to variations of the anode voltage drop; or
   (b) when a predetermined voltage difference between the anode and the cathode is maintained, then said variable intensity is varied being directly proportional to an electric current run through the anode.

4. The method according to claim 2, wherein said linear plasma-optical system further includes:
   a third electromagnetic coil encircling the anode, and
   a deflection electromagnetic coil internally mounted within said anode coaxially therewith;
wherein
   said additional magnetic field components are excited at least within said anode by the third electromagnetic coil and the deflection electromagnetic coil.

5. The method according to claim 1, wherein said plasma-optical system further includes:
   an electromagnetic coil encircling said plasma guide for creating said constant magnetic field component within the plasma-optical system;
   at least one additional electromagnetic coil encircling at least a portion of said plasma guide;
   said intensity-variable additional magnetic field components are excited in said plasma guide by said at least one additional electromagnetic coil; and
wherein
   an electric current runs through said at least one additional electromagnetic coil and through said plasma guide.

6. The method according to claim 5, wherein:
   said plasma flows are transported from the anode through the plasma guide;
   said plasma guide further comprises an inlet part and an outlet part; and
   said inlet part and said outlet part are mutually electrically insulated, and are electrically insulated from the anode.

7. The method according to claim 6, wherein:
   said at least one additional electromagnetic coil encircles said inlet part; and
   an electric current runs through said additional electromagnetic coil and through said outlet part.

8. A linear plasma-optical system for transporting vacuum arc cathode plasma flows with macroparticle filtering, said system comprising:
   a cathode;
   an anode;
   a plurality of electromagnetic coils for creating a constant magnetic field component within the plasma optical system; said plurality of electromagnetic coils includes an anode electromagnetic coil encircling said anode;
   an arc current power supply source including a positive terminal;
   an electro-conductive tube segment coaxially mounted inside the anode and electrically connected thereto, said tube segment has a closed butt end facing the cathode;
   a deflection electromagnetic coil internally mounted within said tube segment coaxially therewith;
wherein:
   said positive terminal of the arc current power supply source is electrically connected to the anode through said anode electromagnetic coil, and electrically connected to the segment tube through said deflection electromagnetic coil.

9. The system according to claim 8, wherein deflection electromagnetic coil is designed as a water-cooled pipe.

10. The system according to claim 8, further comprising:
    a plasma guide mounted adjacently to said anode;
    a guide electromagnetic coil encircling the plasma guide, said guide electromagnetic coil with a first end is electrically connected to said plasma guide;
    a supplemental power supply source including:
       a positive terminal electrically connected to a second end of said guide electromagnetic coil, and
       a negative terminal electrically connected to said anode.

11. The system according to claim 8, further including a plasma guide mounted adjacently to said anode; said plasma guide comprising:
    an inlet part situated adjacently to said anode and electrically insulated from said anode, and
    an outlet part situated distantly from said anode and electrically insulated from said anode;
wherein
    said inlet part is electrically insulated from said outlet part.

12. The system according to claim 11, wherein:
said plurality of electromagnetic coils further includes a guide electromagnetic coil encircling said inlet part of the plasma guide; said guide electromagnetic coil with a first end is electrically connected to said outlet part;
said system further comprises:
a supplemental power supply source including:
a positive terminal electrically connected to a second end of said guide electromagnetic coil, and
a negative terminal electrically connected to said anode.

* * * * *